United States Patent
Lee

(10) Patent No.: US 9,412,677 B2
(45) Date of Patent: Aug. 9, 2016

(54) COMPUTER SYSTEMS HAVING AN INTERPOSER INCLUDING A FLEXIBLE MATERIAL

(75) Inventor: Teck Kheng Lee, Singapore (SG)

(73) Assignee: Micron Technology, Inc., Boise, ID (US)

( * ) Notice: Subject to any disclaimer, the term of this patent is extended or adjusted under 35 U.S.C. 154(b) by 1046 days.

(21) Appl. No.: 11/841,351

(22) Filed: Aug. 20, 2007

(65) Prior Publication Data

US 2007/0285884 A1    Dec. 13, 2007

Related U.S. Application Data

(62) Division of application No. 11/397,459, filed on Apr. 4, 2006, now Pat. No. 7,397,129, which is a division of application No. 10/923,588, filed on Aug. 19, 2004, now Pat. No. 7,105,918.

(30) Foreign Application Priority Data

Jul. 29, 2004  (SG) .................................. 200404350

(51) Int. Cl.
*H01L 23/13* (2006.01)
*H01L 23/00* (2006.01)
(Continued)

(52) U.S. Cl.
CPC ............ *H01L 23/13* (2013.01); *H01L 23/4985* (2013.01); *H01L 23/49827* (2013.01);
(Continued)

(58) Field of Classification Search
CPC ............................ H01L 25/0657; H01L 24/48
USPC ................................... 257/79–103, 666–796
See application file for complete search history.

(56) References Cited

U.S. PATENT DOCUMENTS 4,642,889 A    2/1987  Grabbe
4,648,179 A    3/1987  Bhattacharyya et al.
(Continued)

FOREIGN PATENT DOCUMENTS

EP    0 054 899 A1    6/1982
EP    0 443 502 A1    8/1991

OTHER PUBLICATIONS

Search and Examination Report, Singapore Application No. 200800814-6, Jan. 17, 2011, 16 pages.
(Continued)

*Primary Examiner* — Mark Tornow
*Assistant Examiner* — Abbigale Boyle
(74) *Attorney, Agent, or Firm* — TraskBritt

(57) ABSTRACT

Various embodiments of an interposer for mounting a semiconductor die, as well as methods for forming the interposer, are disclosed. The interposer includes flexible solder pad elements that are formed from a core material of the interposer, such that the interposer may absorb thermally induced stresses and conform to warped or uneven surfaces. Embodiments of electronic device packages including a semiconductor die mounted to and electrically connected to the interposer, as well as methods for forming the electronic device packages, are also disclosed. In one electronic device package, the semiconductor die is electrically connected to the interposer with wire bonds attached to a routing layer of the interposer. In another electronic device package, the semiconductor die is electrically connected to the interposer by bonding the semiconductor die to the flexible solder pad elements of the interposer in a flip-chip configuration. A computer system incorporating an electronic device package with an interposer according to the present invention is also disclosed.

20 Claims, 11 Drawing Sheets

(51) Int. Cl.
*H01L 23/498* (2006.01)
*H05K 3/34* (2006.01)
*H05K 3/40* (2006.01)
*H01L 23/31* (2006.01)
*H01L 25/065* (2006.01)
*H01L 25/16* (2006.01)
*H05K 1/02* (2006.01)

(52) U.S. Cl.
CPC ............... *H01L24/32* (2013.01); *H01L 24/83* (2013.01); *H05K 3/3436* (2013.01); *H05K 3/4007* (2013.01); *H01L 23/3128* (2013.01); *H01L 23/49816* (2013.01); *H01L 23/49838* (2013.01); *H01L 24/48* (2013.01); *H01L 24/73* (2013.01); *H01L 24/81* (2013.01); *H01L 25/0655* (2013.01); *H01L 25/16* (2013.01); *H01L 2224/16225* (2013.01); *H01L 2224/16235* (2013.01); *H01L 2224/2919* (2013.01); *H01L 2224/32013* (2013.01); *H01L 2224/32225* (2013.01); *H01L 2224/48091* (2013.01); *H01L 2224/48227* (2013.01); *H01L 2224/73204* (2013.01); *H01L 2224/73265* (2013.01); *H01L 2224/8121* (2013.01); *H01L 2224/81815* (2013.01); *H01L 2224/8385* (2013.01); *H01L 2224/83385* (2013.01); *H01L 2924/01002* (2013.01); *H01L 2924/014* (2013.01); *H01L 2924/01019* (2013.01); *H01L 2924/01027* (2013.01); *H01L 2924/01029* (2013.01); *H01L 2924/01032* (2013.01); *H01L 2924/01033* (2013.01); *H01L 2924/01047* (2013.01); *H01L 2924/01076* (2013.01); *H01L 2924/01078* (2013.01); *H01L 2924/01079* (2013.01); *H01L 2924/01082* (2013.01); *H01L 2924/0665* (2013.01); *H01L 2924/07802* (2013.01); *H01L 2924/12041* (2013.01); *H01L 2924/15151* (2013.01); *H01L 2924/15311* (2013.01); *H01L 2924/181* (2013.01); *H01L 2924/19041* (2013.01); *H01L 2924/19042* (2013.01); *H01L 2924/19043* (2013.01); *H01L 2924/19105* (2013.01); *H01L 2924/351* (2013.01); *H05K 1/0271* (2013.01); *H05K 1/0284* (2013.01); *H05K 2201/09036* (2013.01); *H05K 2201/09045* (2013.01); *H05K 2201/09481* (2013.01); *H05K 2201/10719* (2013.01); *Y02P 70/613* (2015.11)

(56) References Cited

U.S. PATENT DOCUMENTS

| | | | |
|---|---|---|---|
| 4,847,146 A * | 7/1989 | Yeh et al. | 428/332 |
| 5,086,558 A | 2/1992 | Grube et al. | |
| 5,239,448 A | 8/1993 | Perkins et al. | |
| 5,352,926 A * | 10/1994 | Andrews | H01L 23/34 257/717 |
| 5,371,654 A * | 12/1994 | Beaman | G01R 1/07307 174/16.3 |
| 5,386,627 A | 2/1995 | Booth et al. | |
| 5,438,224 A * | 8/1995 | Papageorge et al. | 257/777 |
| 5,468,681 A * | 11/1995 | Pasch | G03F 7/70433 156/329 |
| 5,529,504 A * | 6/1996 | Greenstein | G01R 1/0735 29/831 |
| 5,631,557 A | 5/1997 | Davidson | |
| 5,938,452 A * | 8/1999 | Wojnarowski | 439/67 |
| 6,031,292 A | 2/2000 | Murakami et al. | |
| 6,050,832 A * | 4/2000 | Lee et al. | 439/91 |
| 6,080,936 A | 6/2000 | Yamasaki et al. | |
| 6,258,627 B1 | 7/2001 | Benenati et al. | |
| 6,266,874 B1 | 7/2001 | DiStefano et al. | |
| 6,312,614 B1 | 11/2001 | Arimitsu et al. | |
| 6,459,150 B1 | 10/2002 | Wu et al. | |
| 6,469,592 B2 * | 10/2002 | Huang et al. | 333/33 |
| 6,521,530 B2 * | 2/2003 | Peters et al. | 438/667 |
| 6,577,013 B1 * | 6/2003 | Glenn et al. | 257/777 |
| 6,586,830 B2 | 7/2003 | Saito | |
| 6,586,845 B1 | 7/2003 | Higashi et al. | |
| 6,628,527 B2 * | 9/2003 | Muramatsu et al. | 361/768 |
| 2001/0019852 A1 * | 9/2001 | Hashimoto | 438/106 |
| 2002/0011657 A1 | 1/2002 | Saito | |
| 2002/0171143 A1 * | 11/2002 | Kinsman | H01L 21/563 257/737 |
| 2003/0146510 A1 | 8/2003 | Chien | |
| 2003/0166312 A1 | 9/2003 | Lee | |
| 2003/0228774 A1 * | 12/2003 | Zaderej | H01R 13/2414 439/71 |
| 2003/0233134 A1 * | 12/2003 | Greenberg | A61N 1/0543 607/36 |
| 2004/0110400 A1 * | 6/2004 | DelPrete | H01R 13/2414 439/86 |
| 2004/0201396 A1 * | 10/2004 | Pierson et al. | 324/765 |
| 2005/0121768 A1 * | 6/2005 | Edelstein | H01L 21/486 257/698 |
| 2005/0285246 A1 * | 12/2005 | Haba | H01L 23/3128 257/678 |
| 2006/0024861 A1 | 2/2006 | Cordes et al. | |

OTHER PUBLICATIONS

Search and Examination Report, Singapore Application No. 200800816-1, Jan. 17, 2011, 15 pages.

* cited by examiner

COMPUTER SYSTEMS HAVING AN INTERPOSER INCLUDING A FLEXIBLE MATERIAL

CROSS-REFERENCE TO RELATED APPLICATIONS

This application is a divisional of application Ser. No. 11/397,459, filed Apr. 4, 2006, now U.S. Pat. No. 7,397,129 issued Jul. 8, 2008, which is a divisional of application Ser. No. 10/923,588, filed Aug. 19, 2004, now U.S. Pat. No. 7,105,918, issued Sep. 12, 2006, the disclosure of each of which is hereby incorporated herein in its entirety by this reference.

The present application is also related to U.S. Pat. No. 7,422,978, issued Sep. 9, 2008, which is divisional of U.S. Pat. No. 7,105,918, issued Sep. 12, 2006.

BACKGROUND OF THE INVENTION

1. Field of the Invention

The present invention relates generally to packaging of electronic devices in the form of semiconductor dice. More particularly, the present invention relates to embodiments of an interposer for mounting a semiconductor die, wherein the interposer includes flexible solder pad elements configured for attachment to a carrier substrate or to the semiconductor die. The present invention further relates to materials and methods for forming the interposer.

2. State of the Art

An electronic device in the form of a semiconductor die or chip is conventionally manufactured of materials such as silicon, germanium, or gallium arsenide. Circuitry is formed on an active surface of the semiconductor die and may include further levels of circuitry within the die itself. Due to the materials used and the intricate nature of construction, semiconductor dice are highly susceptible to physical damage or contamination from environmental conditions including, for example, moisture. In order to protect a semiconductor die from environmental conditions, it is commonly enclosed within a package that provides hermetic sealing and prevents environmental elements from physically contacting the semiconductor die.

In recent years, the demand for more compact electronic devices has increased, and this trend has led to the development of so called "chip-scale packages" (CSPs). One exemplary CSP design is typified by mounting a semiconductor die to a substrate, termed an interposer, having substantially the same dimensions as the semiconductor die. Bond pads of the semiconductor die are electrically connected to bond pads on a first surface of the interposer, and the semiconductor die is encased within an encapsulant material. Conductive pathways, which may comprise a combination of traces and vias, extend from the interposer bond pads to a second, opposing side of the interposer where they terminate in external electrodes to which further electrical connections are made. Typically, a CSP is then mounted to a carrier substrate, such as a circuit board having a number of other electronic devices attached thereto.

Electrically connecting the bond pads of a semiconductor die to the bond pads of a CSP interposer generally involves using one of two types of interconnection methods, depending on the manner in which the semiconductor die is mounted. As shown by FIG. 1, a CSP 2 is configured with the first interconnection method by mounting a semiconductor die 4 to an interposer 6 with die bond pads 8 in a face-up orientation, and electrically connecting die bonds pads 8 to interposer bond pads 10 with bond wires 12. As shown by FIG. 2, CSP 2' is configured with the second interconnection method by mounting semiconductor die 4 with die bond pads 8 in a face-down or flip-chip orientation, and electrically connecting die bond pads 8 directly to interposer bond pads 10 with conductive elements, such as bumps 14, formed of solder or a conductive adhesive material. Once the interconnection method used for CSP 2 or CSP 2' is complete, semiconductor die 4 is encased within an encapsulant material 15 such as a polymer-based molding compound.

Further, FIGS. 1 and 2 show there are generally two types of external electrode structures used for mounting CSPs to a carrier substrate 16. CSP 2 of FIG. 1 is configured as a land grid array (LGA) type package, wherein the external electrodes comprise solder pads 18 that are intended to be directly attached to corresponding solder pads 20 on a carrier substrate 16. In FIG. 2, CSP 2' is configured as a ball grid array (BGA) type package, wherein the external electrodes comprise solder ball pads 22 having solder balls 24 formed thereon, such that solder balls 24 will be attached to the solder pads 20 on carrier substrate 16.

Although CSPs of the type described above have provided a compact and economical approach to packaging of semiconductor dice, they still present certain disadvantages, especially in terms of the LGA or BGA electrode structures used for mounting CSPs to a carrier substrate.

During the operation of an electronic device configured as a CSP, for example, the functioning of the circuits within the semiconductor die and resistance in the circuit connections of the semiconductor die, interposer, and carrier substrate generate heat. This heating results in the expansion and contraction of all of these components as temperatures rise and fall. Because the semiconductor die, interposer, and carrier substrate are made of different materials exhibiting different coefficients of thermal expansion (CTE), they expand and contract at different rates during thermal cycling. This mismatch in thermal expansion rates places stress on the electrode structures joining the CSP interposer to the carrier substrate, and may eventually cause cracks in the electrode structures leading to the failure of electrical connections.

This thermal stress may be especially problematic with a CSP configured as an LGA type package as in FIG. 1, because the stress is concentrated within the relatively small thickness H of the solder pads 18 between interposer 6 and carrier substrate 16. With a CSP configured as a BGA type package as in FIG. 2, the thermal stress may be more effectively absorbed by being spread across the increased thickness H' provided by the solder balls 24. However, because modern circuitry layouts tend to require increasing numbers of I/Os, the external electrodes on a CSP must be very densely spaced, and there are physical limits to the minimum spacing that may be attained when forming solder balls 24. The conventional process of printing and reflowing solder paste on solder ball pads 22 to form solder balls 24, for example, requires that solder ball pads 22 must be spaced at a pitch of about 0.4 mm to ensure reliable formation without bridging. Furthermore, high I/O CSPs require the use of smaller diameter solder balls that may not provide a thickness H' sufficient to overcome thermal induced stress failures. Forming a CSP as a BGA type package also includes the additional processing required to form solder balls 24, which is undesirable in terms of mass-scale production.

Another problem associated with prior art package interposers is that the LGA or BGA type external electrode structures are typically formed entirely of metal or metal alloys and are, therefore, rigid. In many cases, one or both of the interposer and the carrier substrate to which it is to be mounted may have uneven surfaces or may become warped by thermal stresses during attachment of a CSP by solder reflow. When his occurs, the space between the interposer and the carrier substrate may vary, and the rigid construction of LGA or BGA type external electrodes in contact with the carrier substrate at narrower spaces may prevent contact by external electrodes at wider spaces.

In view of the foregoing, what is needed is an interposer for a semiconductor die package such as a CSP that is simple and inexpensive to produce and overcomes the problems associated with the prior art external electrode structures used to mount the interposer to a carrier substrate.

BRIEF SUMMARY OF THE INVENTION

In accordance with the present invention, an improved interposer for electronic device packages is disclosed, as well as electronic device packages including such an interposer. The interposer is formed with flexible solder pad elements that overcome the drawbacks associated with prior art external electrode structures. Due to its flexible nature, the interposer of the present invention is more readily able to accommodate thermal induced stresses and is more easily conformed to carrier substrate or semiconductor die surfaces that are warped or uneven. Furthermore, by forming the flexible solder pad elements as a unitary part of core material of the interposer, the interposer manufacturing process is simplified over prior art interposer methods that require additional processing to form or attach conventional external electrode structures.

In one embodiment of the present invention, the interposer comprises a substrate having a first side and an opposing, second side and comprising a flexible core material; at least one flexible solder pad element on the second side of the substrate, wherein the at least one flexible solder pad element comprises a discrete protrusion of the flexible core material extending in a substantially perpendicular direction outwardly from the first side of the substrate and a solder pad on a tip of the protrusion; a conductive via extending from the solder pad of the at least one flexible solder pad element to the second side of the substrate; and a conductive routing layer on the second side of the substrate having at least one bond pad electrically connected to the solder pad of the at least one flexible solder pad element by the conductive via.

In further embodiments of the present invention, the interposer is incorporated into an electronic device package having at least one semiconductor die mounted to and electrically connected to the interposer. According to one embodiment of an electronic device package, the at least one semiconductor die is electrically connected to the interposer by at least one wire bond extending between at least one bond pad of the at least one semiconductor die and the at least one bond pad of the conductive routing layer of the interposer. Under this package embodiment, the at least one flexible solder pad element of the interposer may be attached to a carrier substrate such as a computer circuit board of a computer system. According to another embodiment of an electronic device package, the at least one semiconductor die is electrically connected to the interposer in a flip-chip configuration by a bond between at least one bond pad of the semiconductor die and the at least one bond pad of the interposer. Under this package embodiment, the at least one bond pad of the conductive routing layer of the interposer is attached to a carrier substrate. In another embodiment of the present invention, a plurality of semiconductor devices is mounted to, and electrically connected to, the interposer.

The present invention also discloses methods for forming the interposer and the electronic device packages including the interposer. According to one method, the interposer is formed by providing a substrate comprising a flexible core material having a first side with a first layer of conductive material and a second side with a second layer of conductive material; patterning the second layer of conductive material to form a conductive routing layer having at least one bond pad; forming at least one conductive via extending through the flexible core material between the conductive routing layer and the first layer of conductive material; patterning the first layer of conductive material to form at least one solder pad overlying the at least one conductive via; and removing portions of the flexible core material from the first side of the substrate around the at least one solder pad to form at least one flexible solder pad element comprising a discrete protrusion of the flexible core material extending in a substantially perpendicular direction outwardly from the first side of the substrate.

According to further methods of the present invention, electronic device packages are formed by mounting and electrically connecting at least one semiconductor die to the interposer. According to one method of forming an electronic device package, electrically connecting the at least one semiconductor die to the interposer comprises attaching a wire bond between at least one bond pad of the at least one semiconductor die and the at least one bond pad of the conductive routing layer of the interposer. According to another method of forming an electronic device package, electrically connecting the at least one semiconductor die to the interposer comprises bonding at least one bond pad of the semiconductor die to the at least one bond pad of the interposer in a flip-chip configuration.

Other and further features and advantages will be apparent from the following detailed description of the invention taken in conjunction with the accompanying drawings. The following examples are provided for the purposes of illustration only, and are not intended to be limiting. It will be understood by one of ordinary skill in the art that numerous combinations and modifications are possible for the embodiments presented herein.

BRIEF DESCRIPTION OF THE SEVERAL VIEWS OF THE DRAWINGS

In the drawings, which illustrate what is currently considered to be the best mode for carrying out the invention.

DETAILED DESCRIPTION OF THE INVENTION

Figure 1:
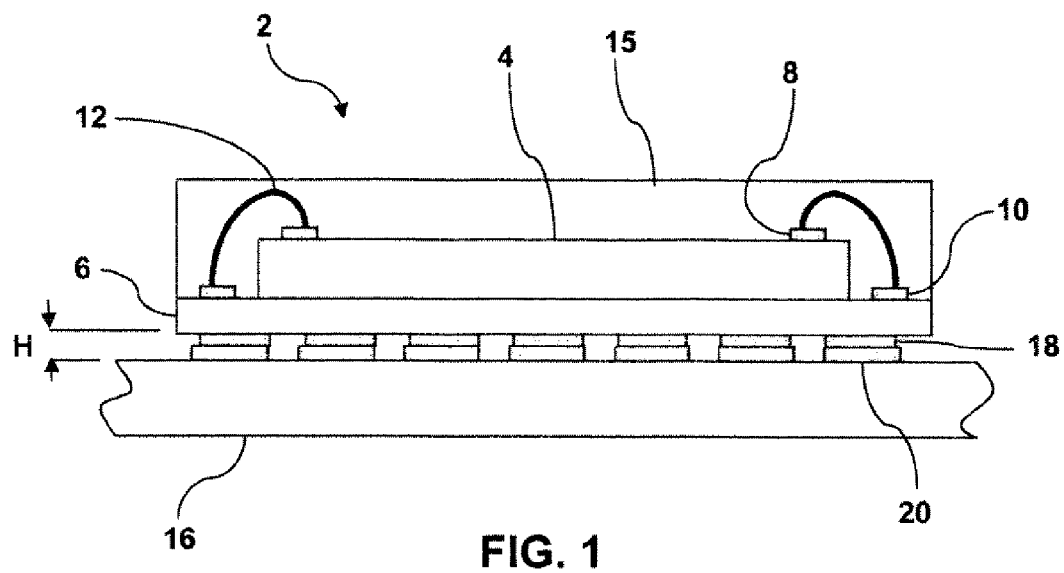
FIG. 1 is a cross-sectional side view of a prior art CSP having wire bond interconnections and LGA type external electrodes.
Figure 2:
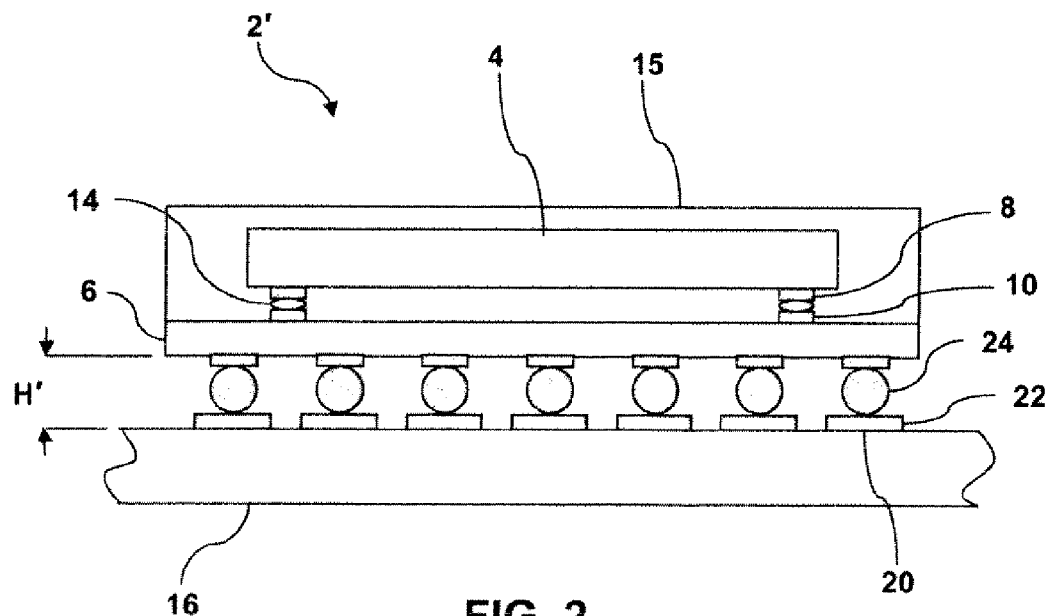
FIG. 2 is cross-sectional side view of a prior art CSP having flip-chip interconnections and BGA type external electrodes.

As described in further detail below, the present invention comprises an interposer for a semiconductor die package and materials and methods for forming such an interposer. While the following is described in terms of an interposer incorporated into a chip-scale package (CSP), it should be understood that the interposer may also be incorporated into other types of electronic device packages which are intended to be mounted to a carrier substrate.

Embodiments of the present invention are described with reference to the accompanying drawings, which illustrate exemplary interposer and CSP structures and methods for their formation. To simplify the description of the present invention, common elements of the various embodiments illustrated by the drawings are designated with like reference numerals. It should be understood that the drawings are not illustrative of actual views of any particular portion of the actual embodiment structures, but are merely idealized schematic representations which are employed to more clearly and fully depict the invention.

Figure 3A:
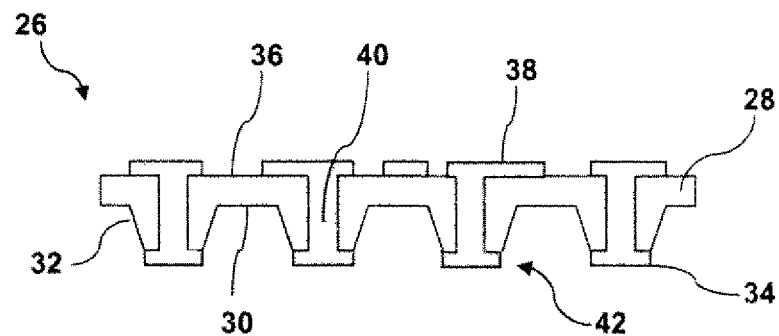
FIGS. 3A-3C are side, top, and bottom views of an interposer according to the present invention.
Figure 3B:
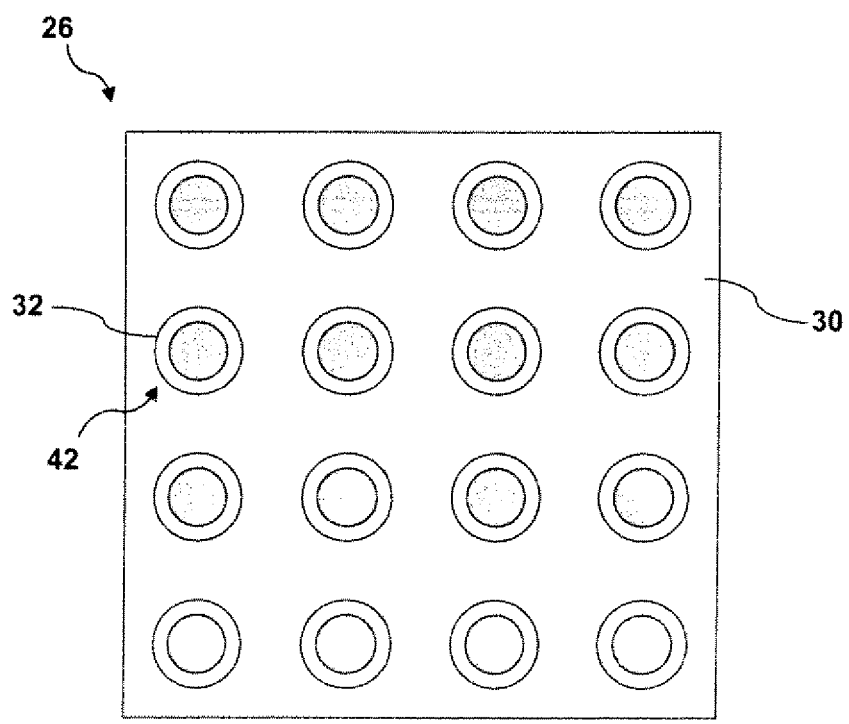
Figure 3C:
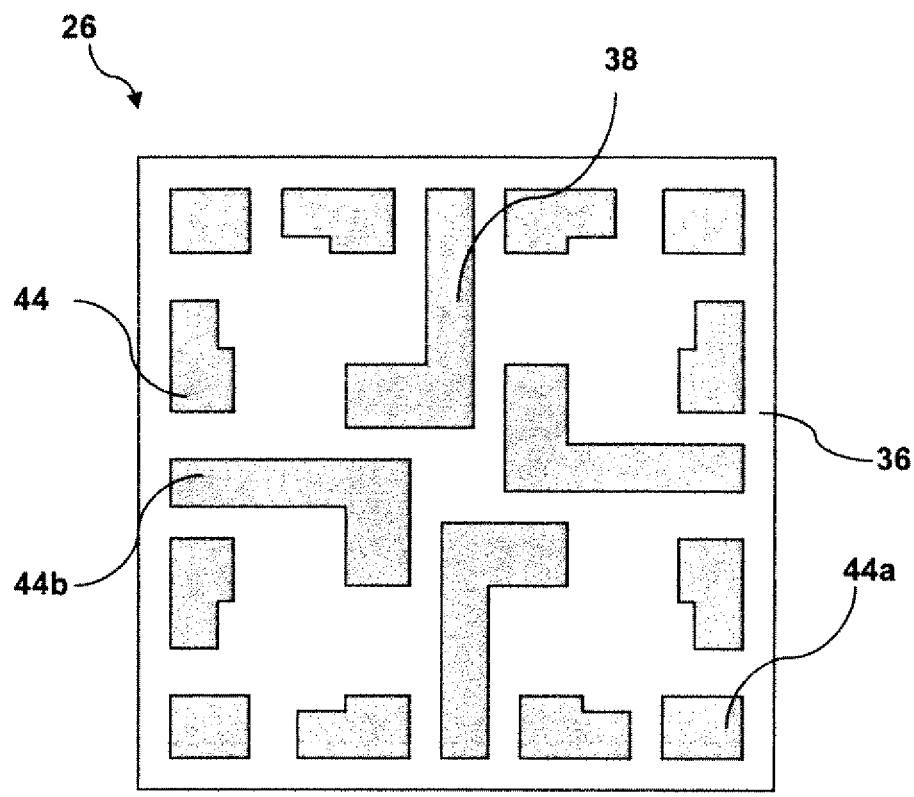

Turning to FIGS. 3A-3C, the general structure of an exemplary interposer 26 according to the present invention is illustrated. Central to interposer 26 is a substrate comprising a flexible core 28 formed of, for example, a conventional flexible circuit material such as a sheet of polyimide or a polyimide-based material. As used herein, the term "flexible" means any material that allows at least one portion of flexible core 28 to be bent or positioned relative to another portion thereof without causing substantial damage to the elements of interposer 26. A first side 30 of flexible core 28 is formed with a plurality of discrete protrusions 32 extending in a substantially perpendicular direction outwardly therefrom, each tipped with a solder pad 34. An opposing, second side 36 of flexible core 28 is substantially planar and includes a conductive routing layer 38. As seen in FIG. 3A, interposer 26 further comprises conductive vias 40 extending through flexible core 28 from solder pads 34 to routing layer 38. Together, discrete protrusions 32, the portions of vias 40 contained therein, and solder pads 34 comprise flexible solder pad elements 42. Both flexible solder pad elements 42 and routing layer 38 may be used to attach interposer 26 to a carrier substrate or semiconductor die as described in further detail below.

FIGS. 3B and 3C are, respectively, bottom and top views of interposer 26 showing the arrangement of flexible solder pad elements 42 and routing layer 38. FIG. 3B shows that flexible solder pad elements 42 are formed in an array pattern across first side 30 of flexible core 28 with discrete protrusions 32 topped by solder pads 34 overlying conductive vias 40 (not shown). As seen in FIG. 3C, routing layer 38 on second side 36 of flexible core 28 is formed with a plurality of bond pads 44 in electrical communication with vias 40 (not shown in FIG. 3C). Bond pads 44 may be located directly above vias 40 in a pad-on-via configuration, as shown by bond pad 44*a*, or may be displaced or offset to an alternate location, as shown by bond pad 44*b*. In this manner the array pattern of flexible solder pad elements 42 on first side 30 of flexible core 28 may be rerouted into an alternate pattern for bond pads 44 on second side of flexible core 28. It should be understood that the arrangement of flexible solder pad elements 42 and routing layer 38 illustrated in FIGS. 3B and 3C is only exemplary, as other patterns may be used depending on the desired location and number of solder pads 34 and bond pads 44 for interposer 26. Likewise, while solder pads 34 are depicted as having a circular shape and bond pads 44 are depicted as rectangular, any shape for either is possible within the scope of the present invention.

Figure 4:
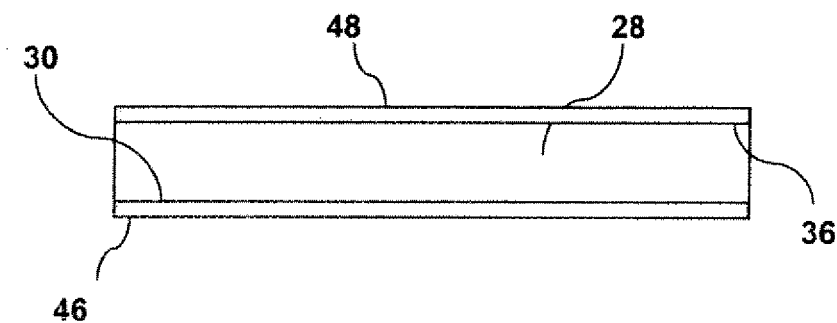
FIGS. 4-11 are cross-sectional views illustrating methods for forming an interposer according to the present invention.

Exemplary methods of manufacturing interposer 26 will now be described with reference to FIGS. 4-11. As seen in FIG. 4, flexible core 28 is initially provided in the form of a substantially planar sheet of flexible circuit material having a first continuous layer of conductive material 46 overlying first side 30 and a second continuous layer of conductive material 48 overlying second side 36. As previously discussed above, flexible core 28 may be formed of polyimide or a polyimide-based material, commercially available examples of which include KAPTON® E polyimide film from DuPont High Performance Materials of Circleville, Ohio, APICAL® polyimide film from Kaneka High-Tech Materials, Inc. of Pasadena, Tex., and UPILEB®-S polyimide film from Ube Industries, Ltd. of Japan. The layers of conductive material 46 and 48 may comprise, by way of example, sheets of a metal or metal alloy such as copper, which are laminated to flexible core 28.

Figure 5:
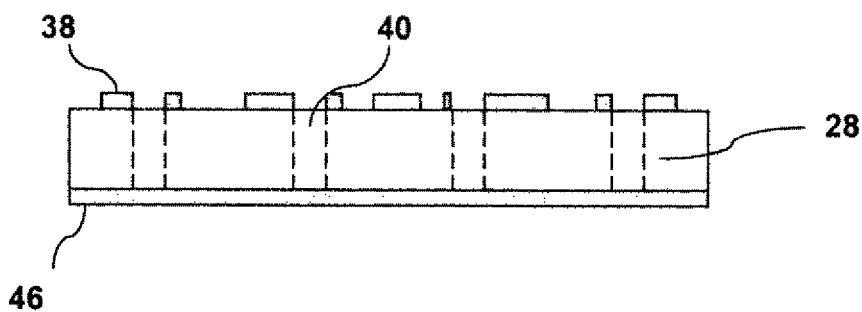

FIG. 5 shows that portions of the second layer of conductive material 48 are removed to form the pattern for routing layer 38. Patterning of routing layer 38 may be carried out using a conventional mask and etch process, wherein a photoresist (not shown) is applied over the layer of conductive material 48 and exposed to a source of radiant energy. Depending on the nature of the photoresist positive or negative), either the exposed or unexposed areas of the photoresist are then removed, and the uncovered portions of the underlying layer of conductive material 48 are subsequently removed by a chemical etchant. If the layer of conductive material comprises copper, for example, a suitable etching process may comprise alkaline etching using ammonium hydroxide, Thereafter, the photoresist is stripped off, with the remaining portions of the layer of conductive material 48 providing routing layer 38. When routing layer 38 is patterned, FIG. 5 shows that the portions of the layer of conductive material 48 overlying the locations where vias 40 (designated by broken lines) are to be formed are also removed in order to provide access to flexible core 28 through routing layer 38.

Figure 6:
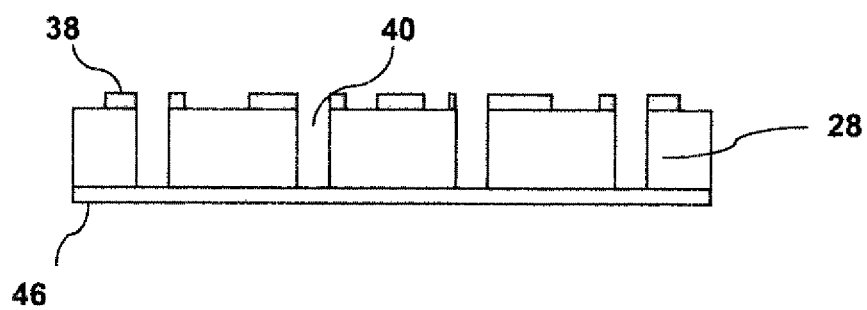

As seen in FIG. 6, vias 40 are then formed in flexible core 28. FIG. 6 shows that vias 40 pass through flexible core 28 and terminate at the first layer of conductive material 46, which is left intact for the subsequent formation of solder pads 34. One process that may be used to form vias 40 without removing the underlying layer of conductive material 46 is by cutting through flexible core 28 with a beam of radiant energy, such as a laser. Based on the materials used for flexible core 28 and the layer of conductive material 46, a laser wavelength may be selected that will be absorbed by and vaporize the portions of flexible core 28 in vias 40 while being substantially reflected by the layer of conductive material 46, which is thereby left intact. In this manner, vias 40 may be formed with highly uniform and tightly controlled dimensions. Other known processes for forming vias 40 may also be used, such as by way of a chemical etchant that selectively etches flexible core 28 without removing the underlying layer of conductive material 46. The chemical etching process may comprise a wet etch, where a fluid solution is applied to remove portions of flexible core 28. If flexible core 28 comprises a polyimide, for example, a solution of potassium hydroxide (KOH) in an ethanol and water solvent would be suitable. Alternatively, the chemical etching process may comprise a dry etch, using known reactive ion etching (RIE) methods. The process used for forming vias 40 may depend, in part, on the desired pitch of flexible solder pad elements 42 on interposer 26. When the pitch is small, vias 40 will be closely spaced together and the high tolerances provided by individually forming each via 40 with a laser may be desirable. For larger pitches, chemical etching may be suitable and will enable vias 40 to be formed more rapidly than with a laser.

Figure 7A:
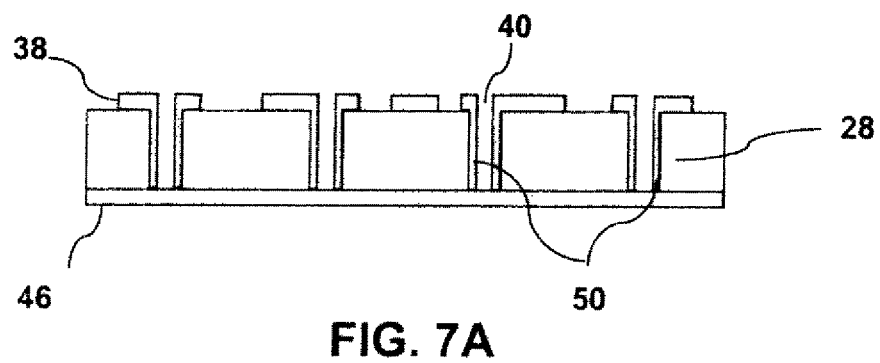
Figure 7B:
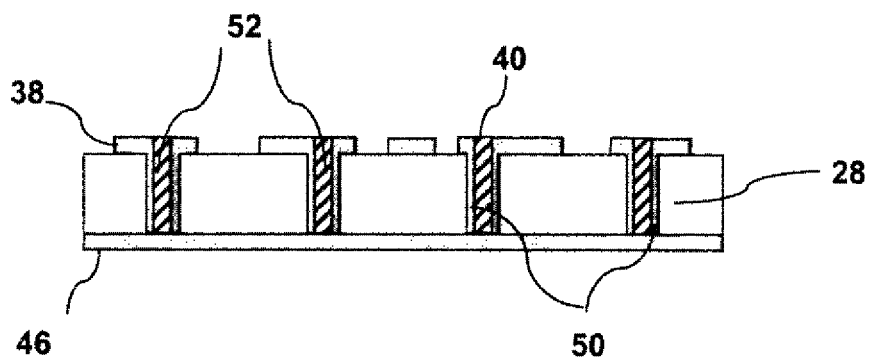

Once vias 40 have been cut through flexible core 28, they are filled to provide conductive pathways between routing layer 38 and the portions of the layer of conductive material 46 that will be formed into solder pads 34. FIGS. 7A-9B show exemplary processes for how vias 40 may be filled. In a first process shown in FIG. 7A-7B, a conductive liner 50 of a metal or metal alloy such as copper is formed onto the interior walls of vias 40. Conductive liner 50 comprises a seed layer deposited within vias 40 using a known electroless plating process, the thickness of which may be added to by a subsequent electroplating process once the seed layer has been formed. Thereafter, as seen in FIG. 7B, vias 40 are completely plugged with a filler material 52.

Depending on the desired characteristics for vias 40, filler material 52 may comprise a conductive or nonconductive material that may be applied in a known fashion, for example, by stencil printing with a squeegee. Examples of suitable nonconductive materials for filling vias 40 by stencil printing include solder mask or epoxy plug materials that are commercially available from vendors such as Taiyo America, Inc. of Carson City, Nev. (sold under the PSR product line). Examples of suitable conductive materials include conductive pastes that are impregnated with copper, silver, lead, or other metal particles, commercially available examples of which include conductive copper paste (product no. AE3030) from Tatsuta Electric Wire & Cable Co. of Japan and silver via plugging material (product no. 1210) from Methode Development Co. of Chicago, Ill.

Figure 8:
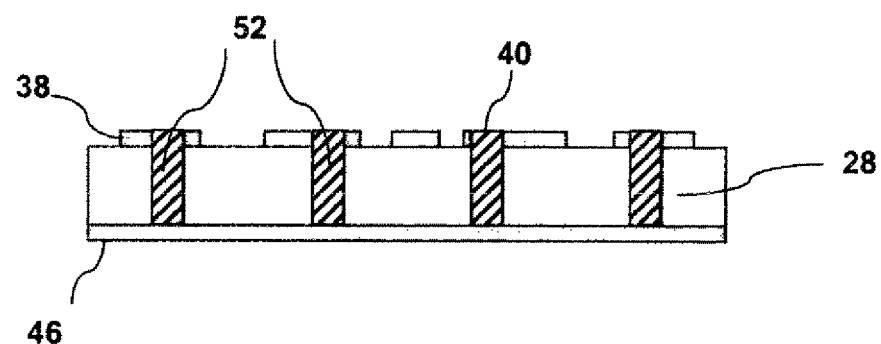
Figure 9A:
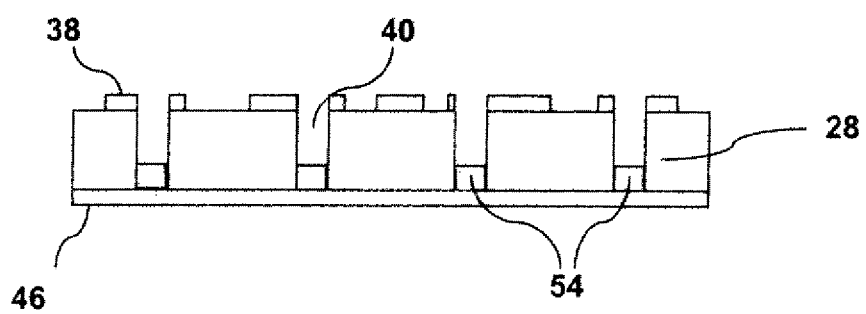
Figure 9B:
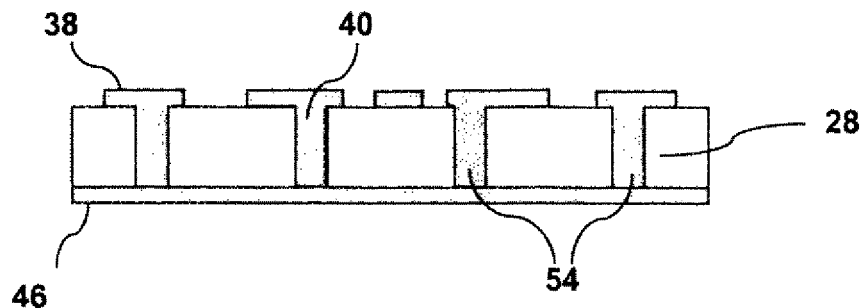

When filling vias 40 with the above-described conductive materials, it is also contemplated that the formation of conductive liner 50 may be omitted. Instead, a conductive filler material 52 may simply be applied by stencil printing to entirely fill the interiors of vias 40, as shown in FIG. 8. FIGS. 9A and 9B show another exemplary process for filling vias 40 by using a conventional electroplating process. Using this approach, FIG. 9A shows that electroplating material 54 in the form of a metal or metal alloy such as copper may be deposited within vias 40 by applying a voltage potential to the underlying layer of conductive material 46 and using the exposed portions of conductive material 46 within vias 40 to act as a cathode to attract electroplating material 54. Additional electroplating material 54 is deposited until vias 40 are filled up to the level of routing layer 38 as shown in FIG. 9B.

Figure 10:
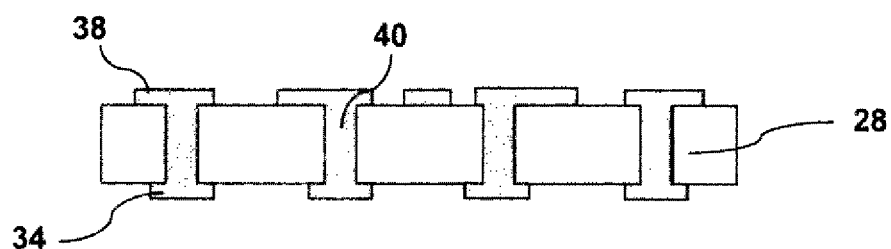

After vias 40 have been filled, FIG. 10 shows that the layer of conductive material 46 may be patterned to form solder pads 34. Solder pads 34 may be formed by using a conventional mask and etch process to remove portions of the layer of conductive material 46 in the same manner as described above with respect to the patterning of routing layer 38. A photoresist (not shown) is applied over the layer of conductive material 46 and exposed to a source of radiant energy projected with the desired pattern for solder pads 34. The photoresist is then stripped off except for the areas overlying the selected locations for solder pads 34, and the remaining uncovered portions of the layer of conductive material 46 are removed by an etching process, as previously discussed with relation to the formation of routing layer 38.

Figure 11:
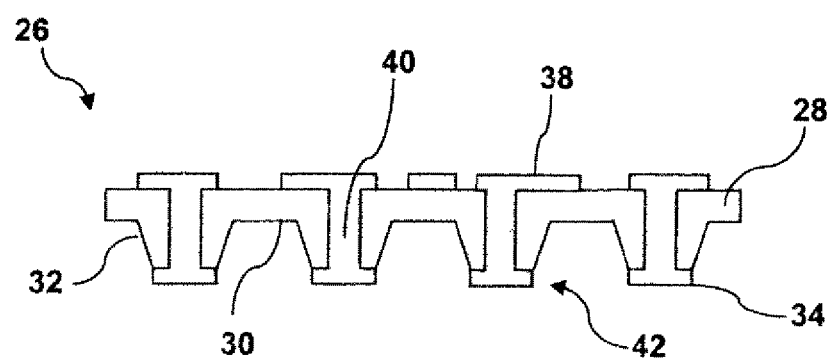

Finally, as seen in FIG. 11, discrete protrusions 32 are formed to complete interposer 26. Discrete protrusions 32 may be formed, by way of example, by applying an etchant to first side 30 of flexible core 28 that selectively etches the material forming flexible core 28 and does not remove the material forming solder pads 34. The etching process may comprise a wet etch, such as by applying a KOH solution as described above with respect to the formation of vias 40, or may comprise a known dry etching process that uses plasma or laser energy to remove portions of flexible core 28. In this manner, solder pads 34 act as a mask for the etching process, with the shape of solder pads 34 defining the resultant profile of discrete protrusions 32. With circular shaped solder pads 34, for example, the etching process may result in discrete protrusions 32 exhibiting a generally conical profile as depicted in FIG. 11. Other profiles for discrete protrusions 32, such as pyramids or columns, may be achieved by altering the shape of solder pads 34 and based on whether an isotropic or anisotropic etching process is used. The desired shape for discrete protrusions 32 may depend on such factors as the required pitch for flexible solder pad elements 42, the flexibility of the material used for flexible core 28, and the layout of the circuitry to which solder pads 34 are to be connected.

As an alternative to the above-described structure of interposer 26, it is also contemplated within the scope of the present invention that flexible solder pad elements 42 may be formed without the inclusion of solder pads 34. Under this embodiment, flexible core 28 illustrated in FIG. 4 may be provided without the first layer of conductive material 46, and vias 40 are then formed through flexible core 28 and plated or filled in the same manner as described with respect to FIGS. 7A-8. Alternatively, flexible core 28 may initially be provided with the first layer of conductive material 46 as shown in FIG. 4 and, after forming vias 40, the first layer of conductive material may be completely removed by an etching process in the same manner as described with respect to FIG. 10. Thereafter, discrete protrusions 32 are formed as described above with respect to FIG. 11, but with the ends of vias 40 exposed through flexible core 28 acting as a mask for the etching process. With the structure of interposer 26 wherein solder pads 34 have been omitted, flexible solder pad elements 42 are attached to a carrier substrate or semiconductor die by connection to the exposed ends of vias 40 on the tips of discrete protrusions 32.

Having described the basic structure of interposer 26 and methods for its formation, it will now be shown how interposer 26 may be incorporated for use in electronic device packages such as CSPs.

Figure 12:
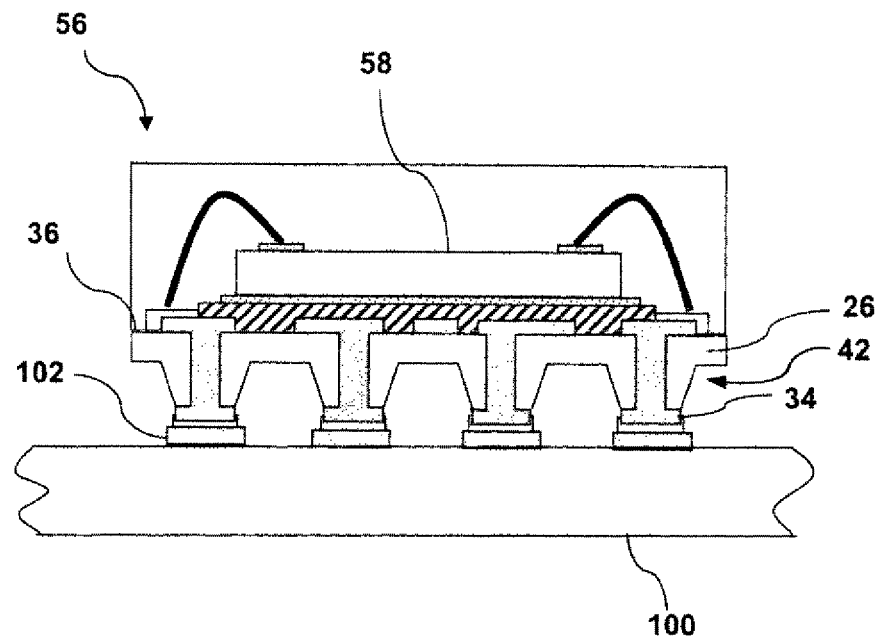
FIG. 12 is a cross-sectional view of a CSP embodiment wherein a semiconductor die is wire bonded to an interposer according to the present invention.

FIG. 12 shows an embodiment of a CSP 56 wherein a semiconductor die 58 is electrically connected to interposer 26 using a wire bond interconnection method. According to this embodiment, semiconductor die 58 is attached to second side 36 of interposer 26 such that solder pads 34 on flexible solder pad elements 42 are oriented for attachment to a carrier substrate 100. CSP 56 is attached to carrier substrate 100 by bonding solder pads 34 to corresponding solder pads 102. Bonding may be effected in any conventional manner, for example, by using solder paste or a conductive or conductor filled adhesive to form a joint between solder pads 34 and solder pads 102.

With this package configuration, flexible solder pad elements 42 provide an interface between CSP 56 and carrier substrate 100 that overcomes the previously described problems associated with prior art LGA and BGA external electrode structures. The compliant nature of the material forming flexible core 28, for example, allows flexible solder pad elements 42 to absorb mismatches in expansion and contraction between carrier substrate 100 and the elements of CSP 56 without the occurrence of high internal stresses. Unlike the rigid LGA and BGA electrode structures, flexible solder pad elements 42 are also able to deform slightly in the vertical direction, thereby accommodating variations in distance between interposer 26 and carrier substrate 100 that may be caused by warped or uneven surfaces. Furthermore, because flexible solder pad elements are formed by etching the material of flexible core 28, they do not require the additional processing involved with forming or attaching solder balls, and may be formed with pitches of 0.25 mm or below.

Figure 13:
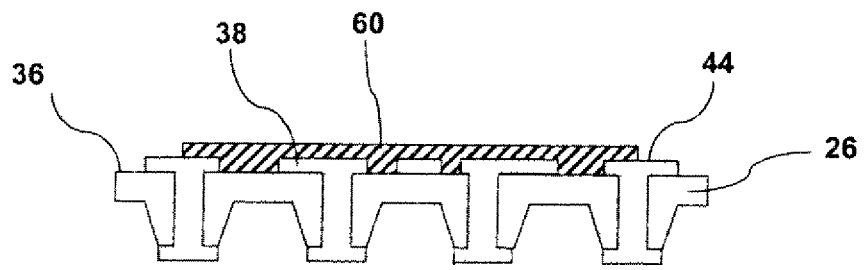
FIGS. 13-16 are cross-sectional views illustrating a method of forming the CSP of FIG. 12.
Figure 14:
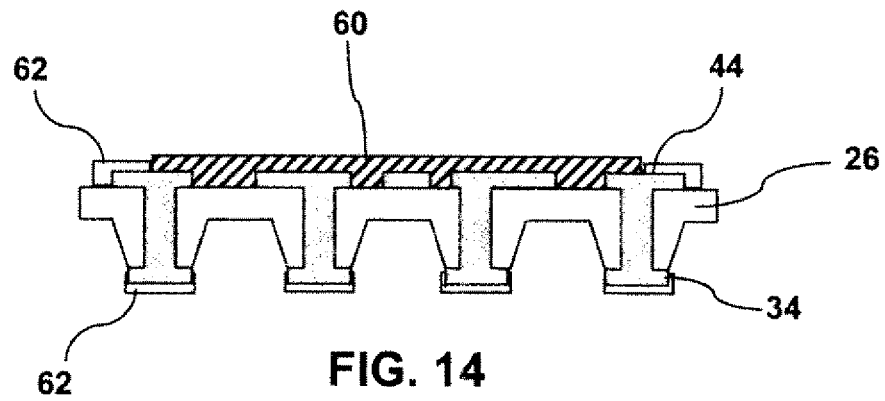
Figure 15:
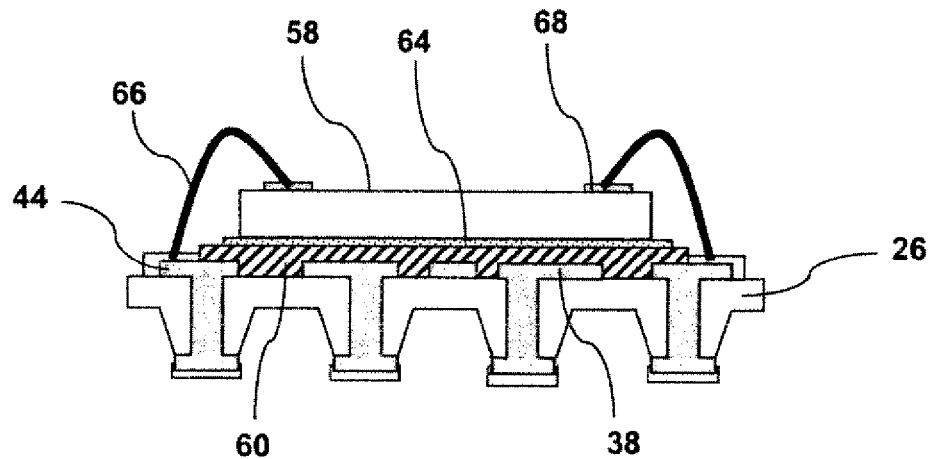
Figure 16:
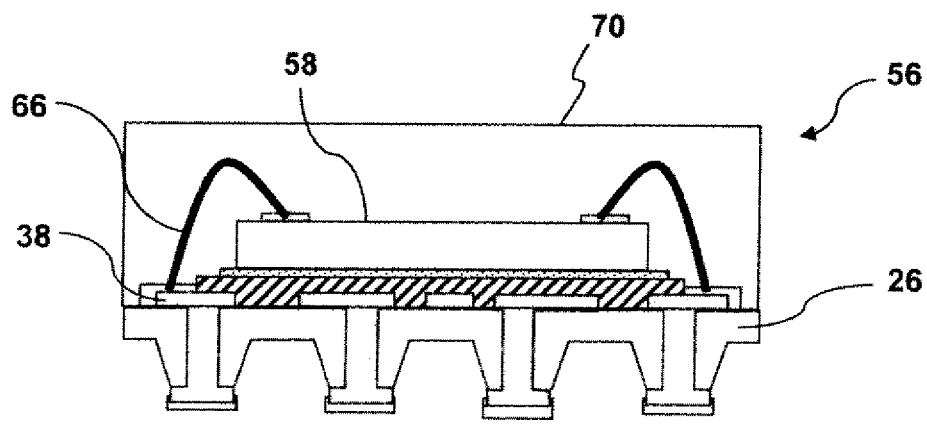

An exemplary method of forming CSP 56 is shown in FIGS. 13-16. First, FIG. 13 shows that a dielectric layer 60 is formed over second side 36 of interposer 26 in order to provide a semiconductor die mounting location that is electrically isolated from routing layer 38. As illustrated in FIG. 13, dielectric layer 60 is sized to cover the central area of interposer 26 while leaving bond pads 44 of routing layer 38 exposed for subsequent wire bonding. Dielectric layer 60 may be formed by deposition of a material such as one of the commercially available solder masks described above with respect to filler material 52; however, other materials may be used as long as they exhibit the desired dielectric isolation properties. FIG. 14 shows that once dielectric layer 60 is formed, metal plating 62 such as sequential layers of nickel and gold may optionally be formed over bond pads 44 and solder pads 34 to improve wettability to solder, if desired or required. Application of metal plating 62 may be accomplished using an electrolytic or electroless plating process as known in the art. Thereafter, FIG. 15 shows that semiconductor die 58 is mounted to dielectric layer 60 with a double-sided tape 64 coated with an adhesive on both sides such as KAPTON® tape, or other adhesive material, and wire bonds 66 are formed between bond pads 44 of routing layer 38 and bond pads 68 of semiconductor die 58. To complete CSP 56, FIG. 16 shows an encapsulant 70 of, for example, a silicon-filled polymer-based molding compound applied using a conventional technique, such as transfer molding, over the second side 36 of interposer 26 to seal routing layer 38, semiconductor die 58, and wire bonds 66 from the surrounding environment.

Figure 17:
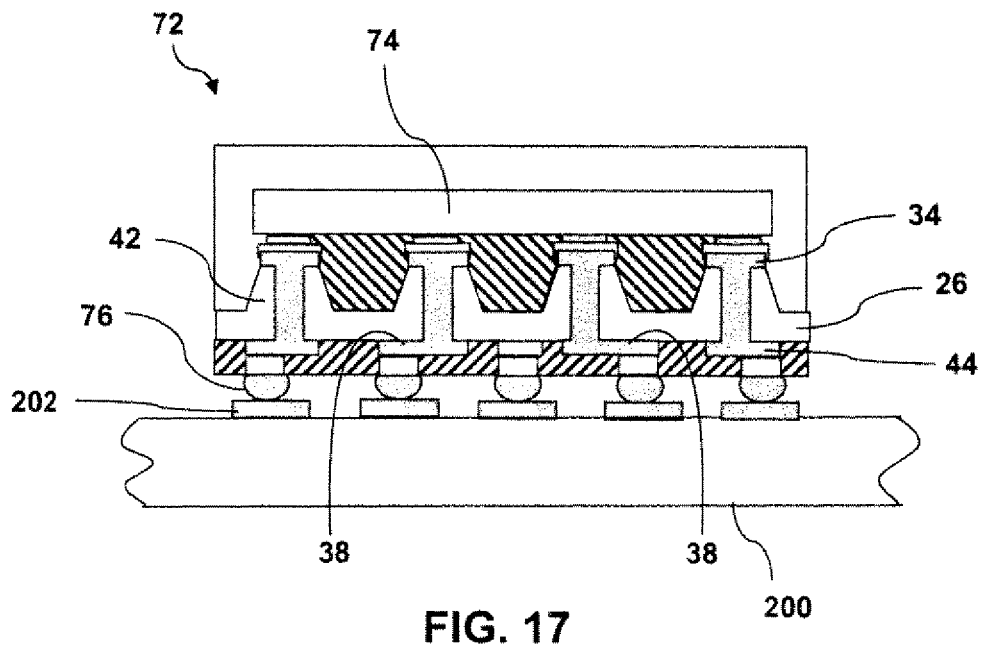
FIG. 17 is a cross-sectional view of a CSP embodiment wherein a semiconductor die is flip-chip mounted to an interposer according to the present invention.

FIG. 17 shows an embodiment of a CSP 72 wherein a semiconductor die 74 is electrically connected to interposer 26 using a flip-chip interconnection method. According to this embodiment, semiconductor die 74 is attached to solder pads 34 on flexible solder pad elements 42, and bond pads 44 of routing layer 38 are oriented for attachment to a carrier substrate 200. As seen in FIG. 17, CSP 72 may be attached to carrier substrate 200 by bonding balls or bumps 76 formed on bond pads 44 to corresponding solder pads 202. Balls or bumps 76 may comprise solder or a conductive or conductor filled adhesive, and may be formed on or attached to bond pads 44 in any conventional manner. Using this package configuration, flexible solder pad elements 42 provide an interface between semiconductor die 74 and interposer 26. Such a configuration may be desirable in situations where the coplanarity of semiconductor die 74 is an issue, or when stress caused by different expansion coefficients between semiconductor die 74 and interposer 26 is a concern.

Figure 18:
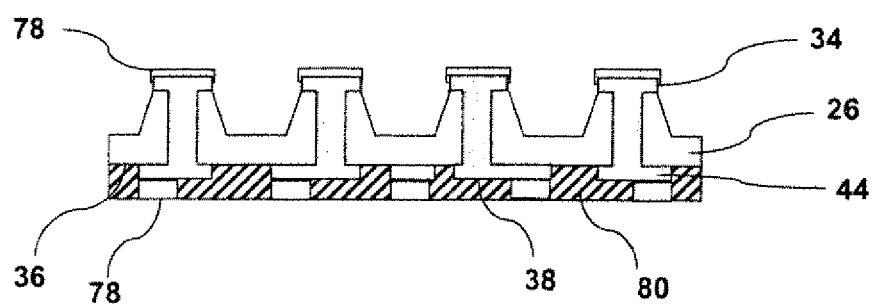
FIGS. 18-20 are cross-sectional views illustrating a method of forming the CSP of FIG. 17.
Figure 19:
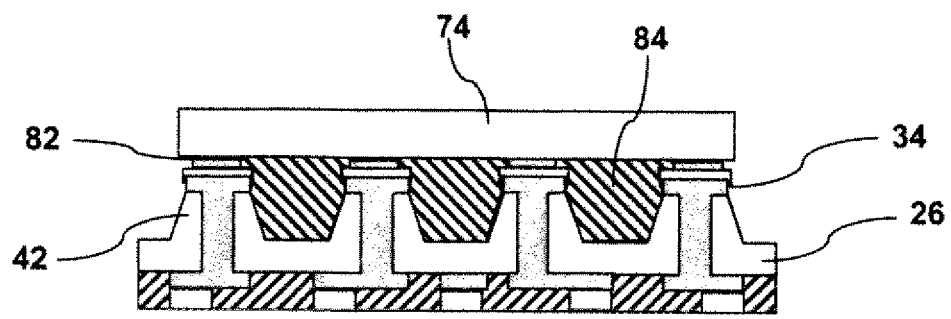
Figure 20:
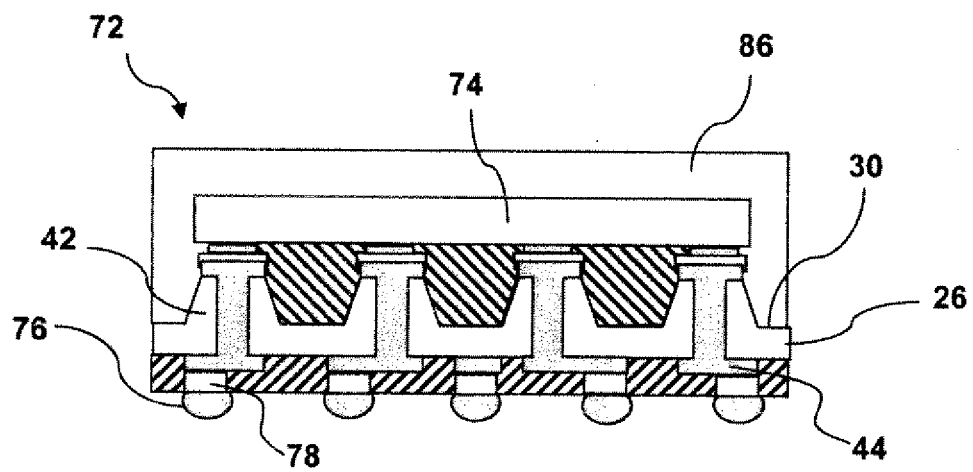

An exemplary method of forming CSP 72 is shown in FIGS. 18-20. First, FIG. 18 shows that metal plating 78, such as sequential layers of nickel and gold, may be formed over bond pads 44 and solder pads 34 the same manner described with respect to CSP 56 if necessary or desirable to improve wettability. A solder mask 80 of the type described with respect to dielectric layer 60 may also be applied to second side 36 of interposer 26 to protect and isolate routing layer 38, with bond pads 44 being left exposed for subsequent attachment to carrier substrate 200. Thereafter, in FIG. 19, semiconductor die 74 is mounted to solder pads 34 by flip-chip attachment of semiconductor die bond pads 82 using a solder paste or other conductive or conductive filled adhesive material as known in the art. FIG. 19 shows that the spaces between semiconductor die 74 and flexible solder pad elements 42 may optionally be filled with an underfill material 84 to seal the underside of semiconductor die 74 and reinforce the attachment with interposer 26. Application of underfill material 84 may be accomplished, by way of example, using a conventional capillary-flow filling process. Underfill material 84 may comprise any conventional nonconductive adhesive material. Alternatively, underfill material 84 may comprise an anisotropic or "Z-axis" conductive material, in which case semiconductor die bond pads 82 may be electrically connected to solder pads 34 by underfill material 84 itself. Once semiconductor die 74 has been mounted, FIG. 20 shows that an encapsulant 86 such as the aforementioned polymer-based molding compound is then applied over the first side 30 of interposer 26 to seal flexible solder pad elements 42 and semiconductor die 74 from the surrounding environment, and balls or bumps 76 are formed on or attached to metal plating 78 and bond pads 44.

Figure 21:
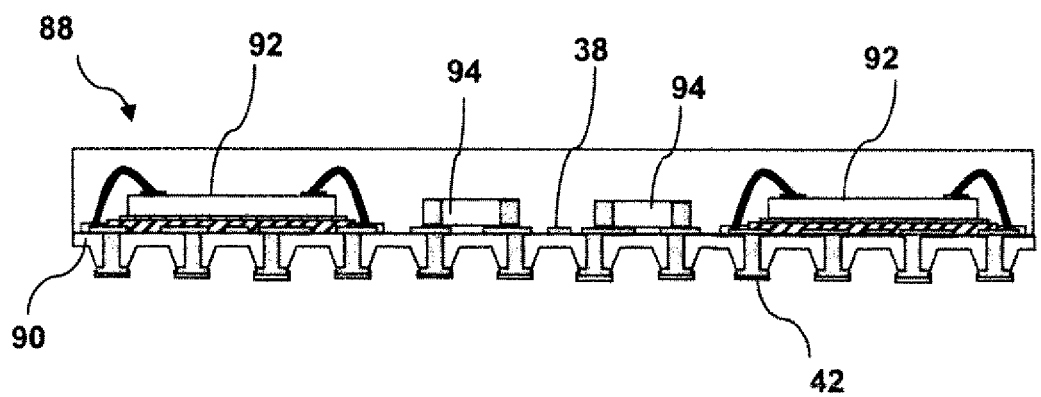
FIG. 21 is a cross-sectional view of an MCM including an interposer according to the present invention.

While described in terms of being formed for incorporation into individual CSPs 56 and 72, an interposer according to the present invention may be used for other types of electronic device packages. FIG. 21 shows one such electronic device package in the form of a multichip module (MCM) 88. As seen in FIG. 21, MCM 88 includes an interposer 90 having a routing layer 38 and flexible solder pad elements 42 configured for electrically connecting multiple semiconductor dice 92. FIG. 21 also shows that electronic components 94 other than semiconductor dice, such as passive resistors, capacitors, or inductors, may also be included in MCM 88 by mounting to interposer 90.

Figure 22:
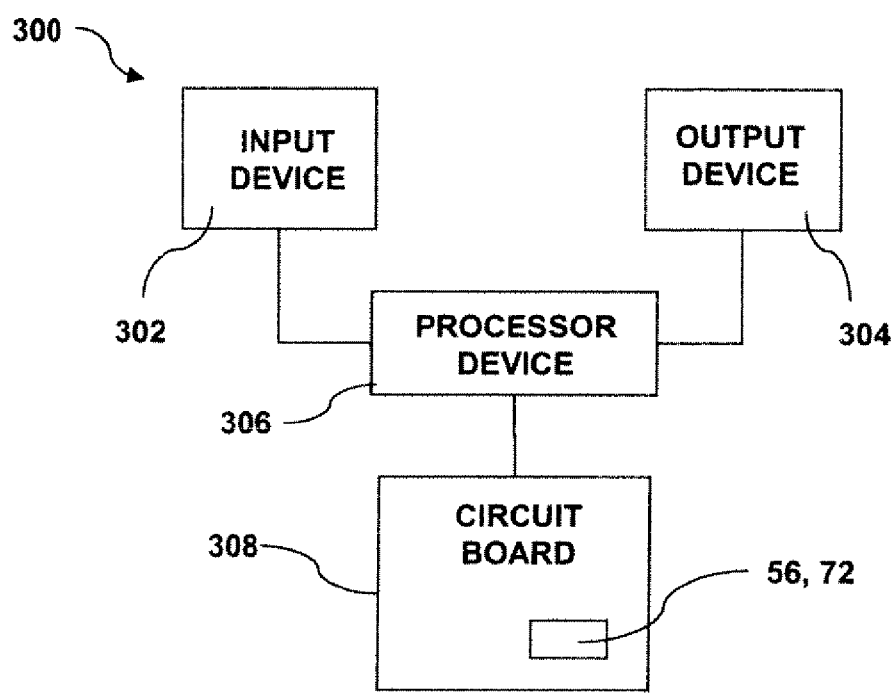
FIG. 22 is a schematic diagram of a computer system incorporating an electronic device having an interposer according to the present invention.

Referring to FIG. 22, depicted is a computer system 300 that includes an input device 302 and an output device 304 coupled to a processor device 306, which, in turn, is coupled to a circuit board 308 incorporating at least one of the exemplary CSPs 56 and 72, or various embodiments thereof, as illustrated in drawing FIGS. 12 and 17.

Although the present invention has been described with respect to the illustrated embodiments, various additions, deletions and modifications are contemplated as being within its scope. For instance, other materials aside from the above-described polyimide films may be used for flexible core 28 within the scope of the present invention, as long as they exhibit the desired flexibility and have the capability to be etched or otherwise shaped to include flexible solder pad elements 42. Likewise, while interposer 26 has been illustrated as being configured for forming a single CSP, it is possible that an interposer according to the present invention could be configured to receive multiple semiconductor dice and then singulated for simultaneous formation of multiple CSPs. Furthermore, while FIGS. 12 and 17 illustrate CSPs 56 and 72 wherein interposer 26 is attached to a carrier substrate 100 or semiconductor die 74 by way of solder pads 34, as described above, solder pads 34 may be omitted and carrier substrate 100 or semiconductor die 74 may be directly bonded to exposed ends of vias 40. The scope of the invention is, therefore, indicated by the appended claims rather than the foregoing description. Further, all changes which may fall within the meaning and range of equivalency of the claims and elements and features thereof are to be embraced within their scope.

What is claimed is:
1. A computer system, comprising:
  an input device;
  an output device;
  a processor device;

a computer circuit board configured to electrically connect a plurality of electronic devices; and an electronic device package attached to the computer circuit board and including an interposer comprising:
- a substrate comprising a base having a first side and an opposing, second side, the base comprising a flexible core material;
- at least one flexible solder pad element on the first side of the base of the substrate and comprising:
  - a discrete protrusion comprising the flexible core material extending in a substantially perpendicular direction outwardly from the first side of the base of the substrate; and
  - a single solder pad on a circular apex of the discrete protrusion, the single solder pad exhibiting a circular shape extending completely between and confined within lateral boundaries of the circular apex;
- a conductive via extending from the single solder pad of the at least one flexible solder pad element to the second side of the base of the substrate; and
- a conductive routing material on the second side of the base of the substrate having at least one bond pad electrically connected to the single solder pad of the at least one flexible solder pad element by the conductive via.

2. The computer system of claim 1, wherein the at least one bond pad of the conductive routing material is positioned directly over the conductive via.

3. The computer system of claim 1, wherein at least one of the conductive routing material and the at least one flexible solder pad element comprises a metal material laminated to the flexible core material.

4. The computer system of claim 1, wherein the conductive via comprises a conductive liner surrounding a filler material.

5. The computer system of claim 4, wherein the filler material comprises a nonconductive material.

6. The computer system of claim 1, wherein the conductive via comprises a polymer material impregnated with conductive particles.

7. The computer system of claim 1, wherein the discrete protrusion of the at least one flexible solder pad element has a profile comprising one of a truncated cone, and a truncated pyramid.

8. A computer system, comprising:
- a circuit board configured to electrically connect a plurality of electronic devices; and
- at least one electronic device attached to the circuit board, the at least one electronic device including an interposer comprising:
  - a substrate comprising:
    - a base comprising a flexible core material and having a first side, and an opposing, second side; and
    - at least one discrete protrusion comprising the flexible core material extending outwardly from the first side of the base;
  - a single conductive pad having a lower surface in direct physical contact with an upper surface of an apex of the at least one discrete protrusion, the single conductive pad extending substantially completely between and confined within outermost lateral boundaries of the apex of the at least one discrete protrusion;
  - a conductive routing material on the opposing, second side of the base of the substrate and comprising at least one bond pad; and
  - at least one conductive via extending through the substrate from a center of the single conductive pad and to the at least one bond pad.

9. The computer system of claim 8, wherein the at least one discrete protrusion of the substrate is integral with the base of the substrate.

10. The computer system of claim 8, wherein at least one of the single conductive pad and the at least one bond pad is structurally coupled to a conductive element of the circuit board.

11. A computer system, comprising:
- a circuit board;
- an electronic signal processor device attached to the circuit board;
- a memory device attached to the circuit board and configured to communicate electrically with the electronic signal processor device; and
- an interposer disposed between the circuit board and at least one of the electronic signal processor device and the memory device, the interposer comprising:
  - a substrate comprising a flexible core having a first side and an opposing, second side, the flexible core comprising a polyimide material;
  - an array of flexible electrical contacts on the first side of the flexible core of the substrate, at least one flexible electrical contact of the array comprising:
    - a discrete flexible structure comprising the polyimide material protruding from the first side of the flexible core of the substrate to a circular-shaped tip;
    - a single conductive structure on and completely covering the circular-shaped tip, the single conductive structure confined within boundaries of the circular-shaped tip; and
    - a conductive via extending through a center of the discrete flexible structure from a center of the circular-shaped tip; and
  - a plurality of conductive pads on the second side of the flexible core of the substrate, at least one conductive pad of the plurality of conductive pads configured to communicate electrically with a single conductive structure of the at least one flexible electrical contact through the conductive via of the at least one flexible electrical contact.

12. The computer system of claim 11, wherein the interposer structurally and electrically couples at least one semiconductor die of at least one of the electronic signal processor device and the memory device to the circuit board.

13. The computer system of claim 12, further comprising at least one wire bond extending between at least one conductive element of the at least one semiconductor die and at least one conductive pad of the plurality of conductive pads.

14. The computer system of claim 12, wherein the at least one semiconductor die is mounted to the interposer in a flip-chip configuration.

15. The computer system of claim 14, wherein the at least one semiconductor die is mounted to the second side of the flexible core of the substrate.

16. The computer system of claim 1, wherein the conductive via is located at a central region of the discrete protrusion and extends from a center of the circular apex of the discrete protrusion to the second side of the base of the substrate.

17. The computer system of claim 1, wherein the discrete protrusion is integral with the base of the substrate.

18. The computer system of claim 8, wherein the base and the at least one discrete protrusion each consist of the flexible core material.

19. The computer system of claim 8, wherein the single conductive pad extends laterally outward beyond boundaries of the at least one conductive via.

20. The computer system of claim 8, wherein the single conductive pad extends completely between and is confined within the outermost lateral boundaries of the apex of the at least one discrete protrusion.

\* \* \* \* \*